(12) United States Patent  (10) Patent No.: US 8,928,882 B2
Imaoka  (45) Date of Patent: Jan. 6, 2015

(54) MEASUREMENT APPARATUS, EXPOSURE APPARATUS, AND DEVICE FABRICATION METHOD

(75) Inventor: Nobuo Imaoka, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 238 days.

(21) Appl. No.: 13/428,001

(22) Filed: Mar. 23, 2012

(65) Prior Publication Data

US 2012/0258391 A1 Oct. 11, 2012

(30) Foreign Application Priority Data

Apr. 5, 2011 (JP) ................................. 2011-084076
Mar. 5, 2012 (JP) ................................. 2012-048613

(51) Int. Cl.
*G01B 11/00* (2006.01)
*G01B 11/14* (2006.01)
*G03F 9/00* (2006.01)

(52) U.S. Cl.
CPC ............ *G03F 9/7015* (2013.01); *G03F 9/7088* (2013.01)
USPC .......................................... 356/401; 356/616

(58) Field of Classification Search
CPC .............................. G03F 9/7015; G03F 9/7088
USPC .................... 356/399–401, 614–620
See application file for complete search history.

(56) References Cited

U.S. PATENT DOCUMENTS

| 5,610,715 | A | 3/1997 | Yoshii et al. |
| 6,034,378 | A * | 3/2000 | Shiraishi .................. 250/559.29 |
| 7,027,127 | B2 * | 4/2006 | Kasumi ............................ 355/53 |
| 8,264,669 | B2 * | 9/2012 | Shibazaki ........................ 355/72 |
| 8,547,527 | B2 * | 10/2013 | Kanaya ............................ 355/72 |
| 2008/0088843 | A1 * | 4/2008 | Shibazaki ...................... 356/399 |
| 2009/0033900 | A1 | 2/2009 | Kanaya |
| 2013/0050674 | A1 * | 2/2013 | Prosyentsov et al. ........... 355/72 |

FOREIGN PATENT DOCUMENTS

| JP | 6-341861 A | 12/1994 |
| JP | 7-270122 A | 10/1995 |
| JP | 2009-033165 A | 2/2009 |

\* cited by examiner

*Primary Examiner* — Michael A Lyons
*Assistant Examiner* — Shawn Decenzo
(74) *Attorney, Agent, or Firm* — Rossi, Kimms & McDowell LLP

(57) ABSTRACT

The present invention provides a measurement apparatus which measures a position of a second object relative to a first object, the apparatus including a first measurement unit which includes a diffraction grating provided on the first object, and a first head and a second head provided on the second object, and is configured to measure the position of the second object relative to the first object by the first head or the second head, and a processing unit configured to perform a process of obtaining the position of the second object relative to the first object.

5 Claims, 14 Drawing Sheets

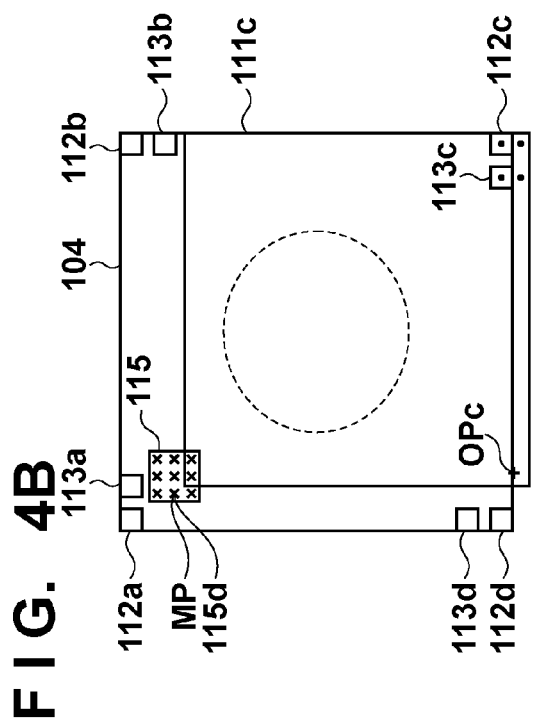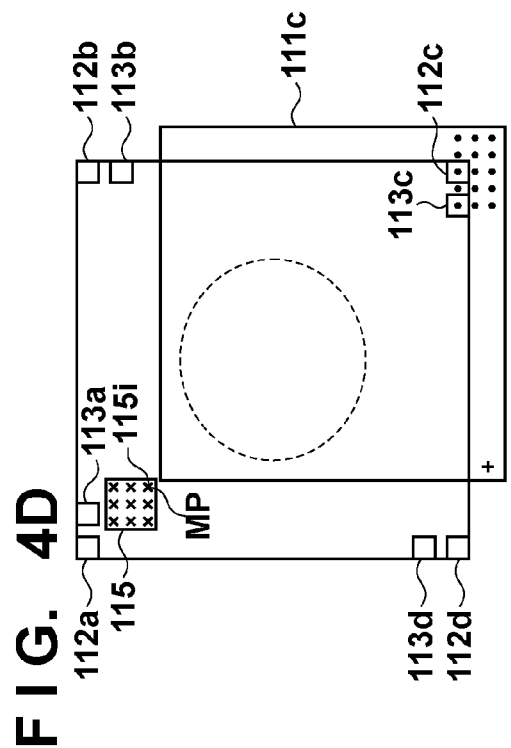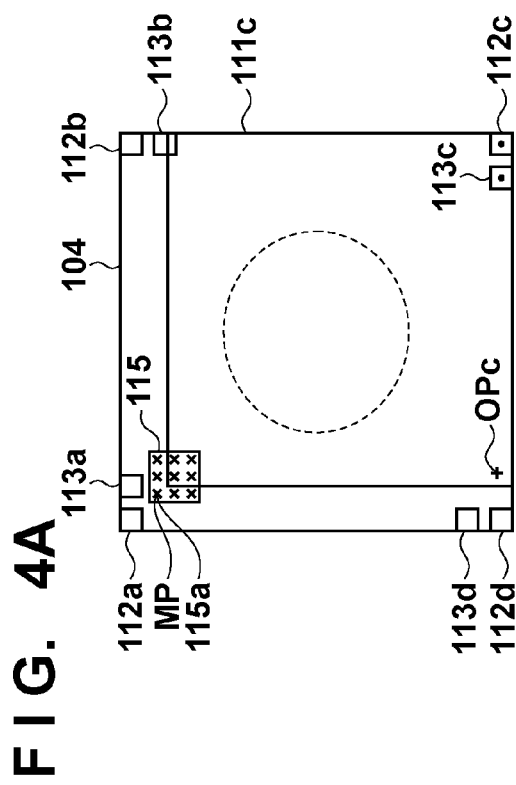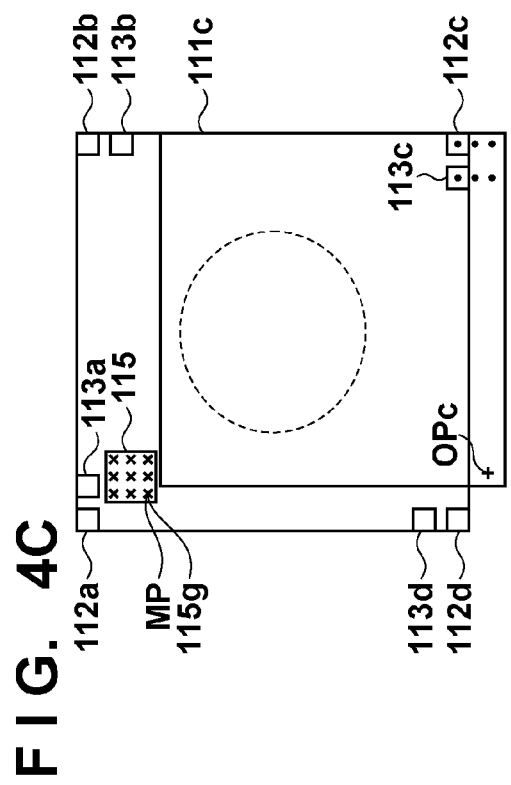

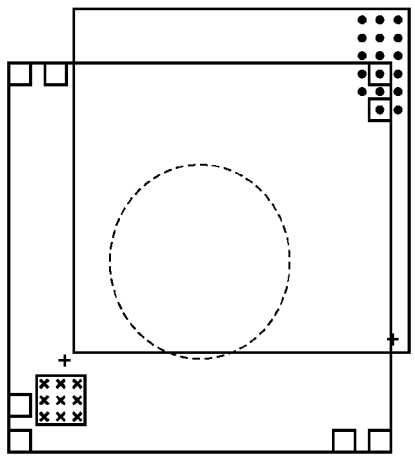
F I G. 6B
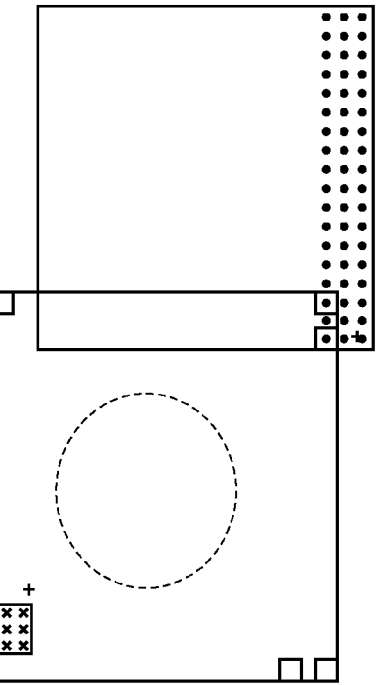
F I G. 6D
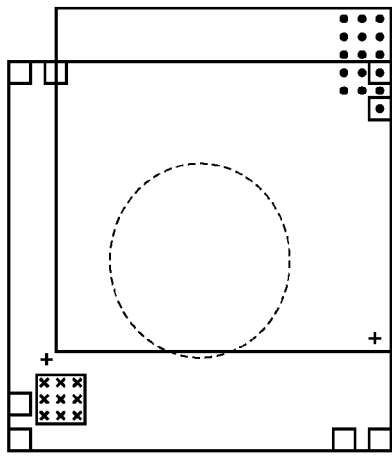
F I G. 6A
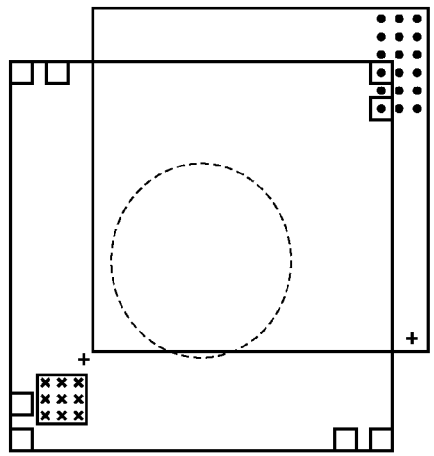
F I G. 6C

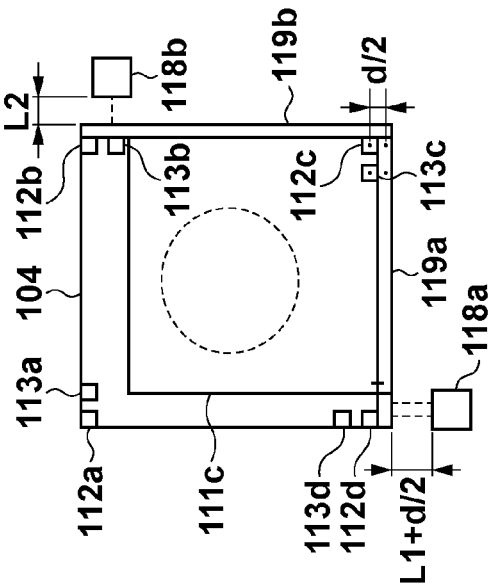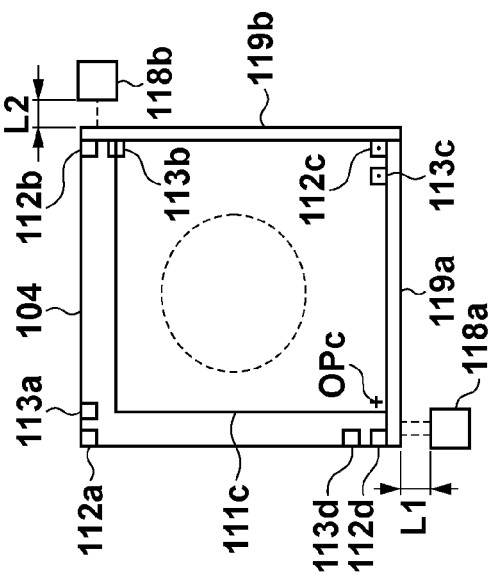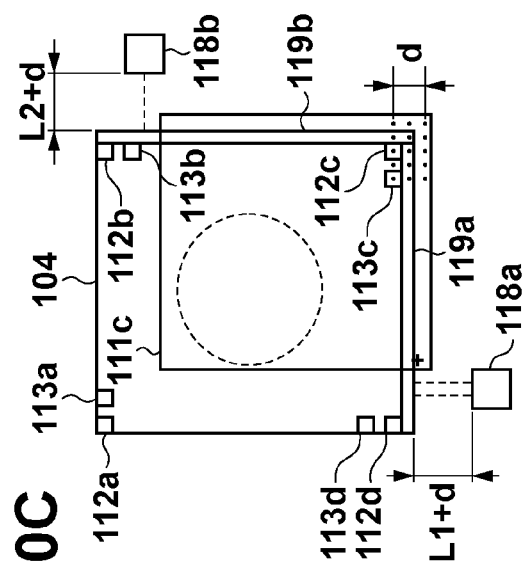

MEASUREMENT APPARATUS, EXPOSURE APPARATUS, AND DEVICE FABRICATION METHOD

BACKGROUND OF THE INVENTION

1. Field of the Invention

The present invention relates to a measurement apparatus, an exposure apparatus, and a device fabrication method.

2. Description of the Related Art

An exposure apparatus which projects and transfers the pattern of a reticle (mask) onto a substrate such as a wafer via a projection optical system is employed to fabricate a semiconductor device using a photolithography technique. The exposure apparatus repeats pattern transfer while changing the shot region on the substrate by moving a stage which holds the substrate. Therefore, to precisely transfer the pattern of the reticle to each shot region on the substrate, it is necessary to accurately position the stage which holds the substrate. Japanese Patent Laid-Open No. 7-270122, No. 6-341861, and No. 2009-33165 propose techniques related to positioning the stage.

Japanese Patent Laid-Open No. 7-270122 proposes a technique of measuring the position of the stage using the interference principle of a diffraction grating. Japanese Patent Laid-Open No. 6-341861 proposes a technique of simultaneously measuring displacements of the stage in two axial directions using, for example, an optical displacement sensor. Japanese Patent Laid-Open No. 2009-33165 proposes a technique of measuring the position of the stage using an interferometer and the interference principle of a diffraction grating together.

Unfortunately, in the related art techniques, measurement errors occur upon measurement of the position of the stage due, for example, to a drawing error resulting from factors associated with drawing of indices on a diffraction grating or a mounting error resulting from factors associated with mounting of the diffraction grating. Measurement errors also occur upon measurement of the position of the stage due, for example, to a change in temperature distribution of a diffraction grating or strain of the diffraction grating with time.

SUMMARY OF THE INVENTION

The present invention provides a technique advantageous in measuring the position of an object.

According to one aspect of the present invention, there is provided a measurement apparatus which measures a position of a second object relative to a first object, the apparatus including a first measurement unit which includes a diffraction grating provided on the first object, and a first head and a second head provided on the second object, and is configured to measure the position of the second object relative to the first object by the first head or the second head, and a processing unit configured to perform a process of obtaining the position of the second object relative to the first object, wherein the processing unit performs a first process of obtaining a deformation amount of the diffraction grating by repeating a process, in which while a position on the diffraction grating previously detected by one head of the first head and the second head is positioned at the center of a field of view of the other head, a position different from the position on the diffraction grating previously detected by the one head is detected, until the one head detects an entire surface of the diffraction grating, and a second process of correcting the position of the second object relative to the first object, which is measured by the first head or the second head, based on the deformation amount of the diffraction grating.

Further features of the present invention will become apparent from the following description of exemplary embodiments with reference to the attached drawings.

BRIEF DESCRIPTION OF THE DRAWINGS

FIGS. 4A to 4D are views showing the positional relationships among the diffraction gratings, first heads, and second heads while alignment marks are detected by an alignment scope.

FIGS. 6A to 6E are views showing the positional relationships among the diffraction grating, first heads, and second heads while the entire surface of the diffraction grating is detected.

FIGS. 10A to 10C are views showing the positional relationships among the diffraction gratings, first heads, and second heads while the position of the substrate stage is measured by the interferometers.

DESCRIPTION OF THE EMBODIMENTS

Figure 1:
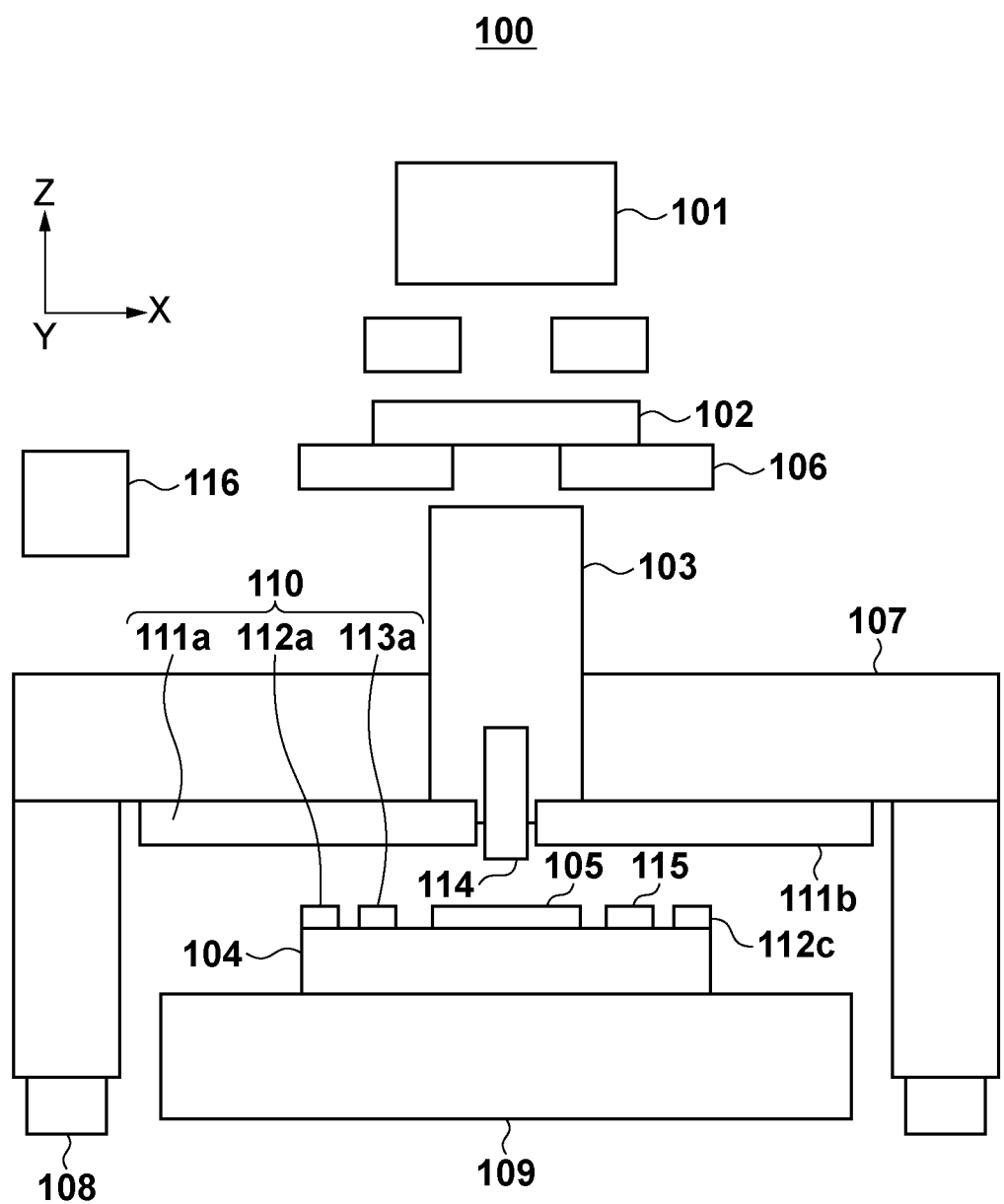
FIG. 1 is a schematic view showing the configuration of an exposure apparatus according to an aspect of the present invention.

Preferred embodiments of the present invention will be described below with reference to the accompanying drawings. Note that the same reference numerals denote the same members throughout the drawings, and a repetitive description thereof will not be given.

FIG. 1 is a schematic view showing the configuration of an exposure apparatus 100 according to an aspect of the present invention. The exposure apparatus 100 is a projection exposure apparatus which illuminates a reticle (mask) 102 by an illumination optical system 101 to expose a substrate 105 held by a substrate stage 104 to light via a projection optical system 103.

The projection optical system 103 projects the pattern of the reticle 102 held by a reticle stage 106 onto the substrate 105 such as a wafer or a liquid crystal substrate. A reference frame 107 which defines an apparatus reference supports the projection optical system 103. A mount 108 has a vibration isolation function for the reference frame 107, and an anti-vibration function for floor vibration. The substrate stage 104 holds the substrate 105. A stage base 109 holds the substrate stage 104.

A measurement unit (first measurement unit) 110 measures the position of the substrate stage 104 as a second object relative to the reference frame 107 as a first object using the interference principle of a diffraction grating. In this embodiment, the measurement unit 110 includes diffraction gratings 111a to 111d, first heads 112a to 112d, and second heads 113a to 113d. The diffraction gratings 111a to 111d are provided (fixed) on the reference frame 107 (its lower surface), and the first heads 112a to 112d and second heads 113a to 113d are provided (fixed) on the substrate stage 104. However, the diffraction gratings 111a to 111d may be provided on the substrate stage 104, and the first heads 112a to 112d and second heads 113a to 113d may be provided on the reference frame 107. Indices (scale marks) are equidistantly formed on the diffraction gratings 111a to 111d with high accuracy. The first heads 112a to 112d and second heads 113b to 113d are opposed to the diffraction gratings 111a to 111d, respectively.

An alignment scope (second measurement unit) 114 is provided separately from the measurement unit 110, and measures the position of the substrate stage 104 by detecting alignment marks formed on an alignment plate 115 fixed on the substrate stage 104. Note that in this embodiment, each alignment mark formed on the alignment plate 115 is assumed to be a mark that can serve to detect the coordinates (position) in two original directions. However, each alignment mark formed on the alignment plate 115 may be a mark that can serve to detect the coordinate (position) in one direction.

A control unit 116 includes, for example, a CPU and memory and controls the overall exposure apparatus 100 (its overall operation). The control unit 116 functions as, for example, a positioning mechanism which controls driving of the substrate stage 104 using, for example, the measurement result obtained by the measurement unit 110 and that obtained by the alignment scope 114 to position the substrate stage 104. Also, in positioning the substrate stage 104, the control unit 116 functions as a processing unit which performs a process of obtaining the position of the substrate stage 104 relative to the reference frame 107, as will be described later.

Figure 2:
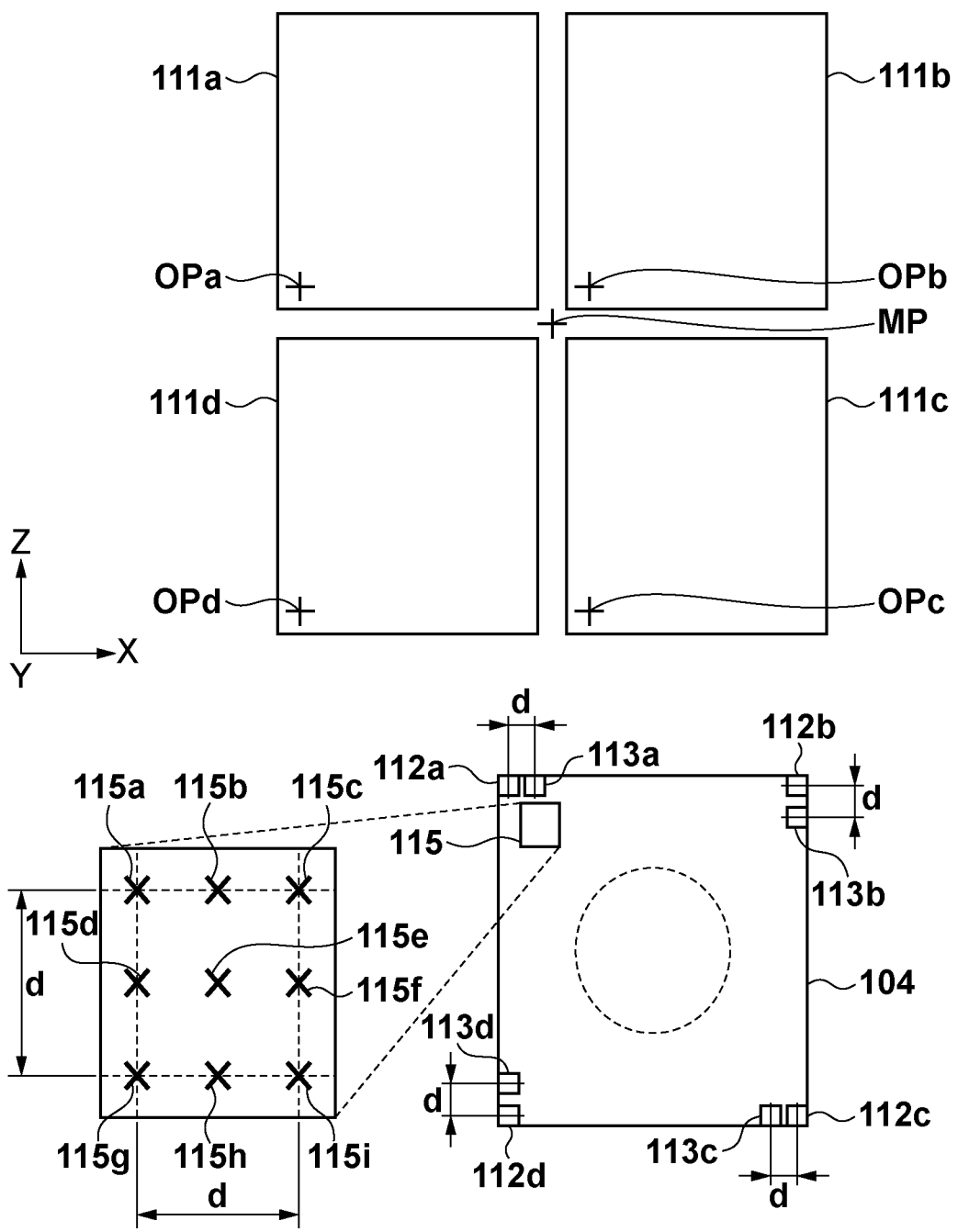
FIG. 2 is a view showing the positional relationships among a substrate stage, diffraction gratings, first heads, second heads, and an alignment plate.

A process associated with positioning of the substrate stage 104 in the exposure apparatus 100 will be described below. FIG. 2 is a view illustrating an example of the positional relationships among the substrate stage 104, diffraction gratings 111a to 111d, first heads 112a to 112d, second heads 113a to 113d, and alignment plate 115.

The interval (distance) between the first head 112a and the second head 113a and that between the first head 112c and the second head 113c are d in the X-axis direction and zero in the Y-axis direction, as shown in FIG. 2. Also, the interval between the first head 112b and the second head 113b and that between the first head 112d and the second head 113d are zero in the X-axis direction and d in the Y-axis direction. A plurality of alignment marks (index detection reference positions) 115a to 115i which can be detected by the alignment scope 114 are formed on the alignment plate 115 equidistantly in the X- and Y-axis directions.

The interval (distance) between the alignment mark 115a formed at the left end and the alignment mark 115c formed at the right end on the alignment plate 115 is d in this embodiment but need only be equal to or larger than d. Similarly, the interval between the alignment mark 115a formed at the upper end and the alignment mark 115g formed at the lower end on the alignment plate 115 is d in this embodiment but need only be equal to or larger than d.

The first heads 112a to 112d, second heads 113a to 113d, and alignment plate 115 are integrally fixed on the substrate stage 104 via a low thermal expansion member such as Zerodur® or Invar. The intervals between the first heads 112a to 112d, second heads 113a to 113d, and alignment plate 115 are always guaranteed, and serve as references to obtain the deformation amounts of the diffraction gratings 111a to 111d. The deformation amounts of the diffraction gratings 111a to 111d mean herein the amounts of relative errors due, for example, to drawing errors of indices drawn on the diffraction gratings 111a to 111d, mounting errors of the diffraction gratings 111a to 111d on the reference frame 107, or strain of the diffraction gratings 111a to 111d.

A process (first process) of obtaining the deformation amounts of the diffraction gratings 111a to 111d will be described. In this embodiment, a two-dimensional incremental diffraction grating is used as the specification of the diffraction gratings 111a to 111d. However, an absolute diffraction grating may be adopted as the specification of the diffraction gratings 111a to 111d.

Figure 3:
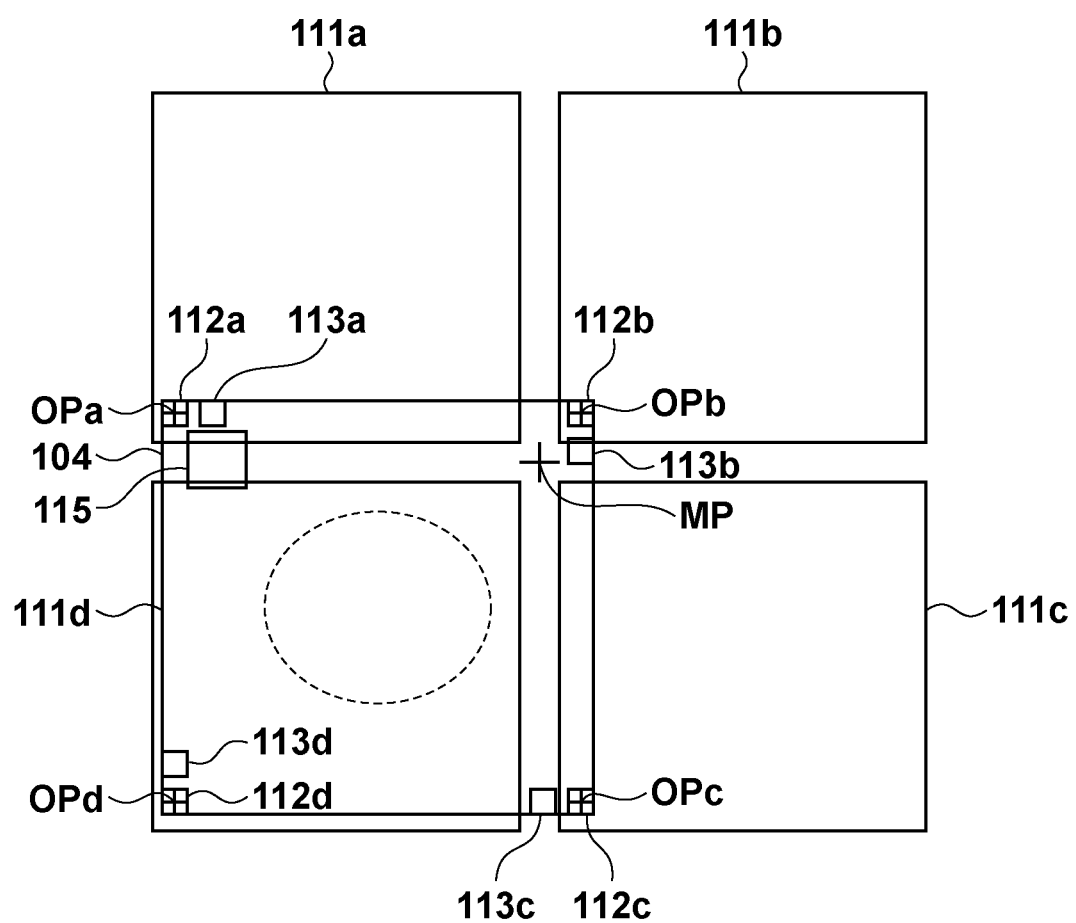
FIG. 3 is a view showing the positional relationships among the diffraction gratings, first heads, and second heads while the substrate stage is positioned at a predetermined position.

First, to detect the origin positions of the diffraction gratings 111a to 111d by the first heads 112a to 112d and second heads 113a to 113d, respectively, the substrate stage 104 is driven to a predetermined position, as shown in FIG. 3. The predetermined position is defined by, for example, butting. Identifiers OPa to OPd that can serve to identify the origin positions are formed on the diffraction gratings 111a to 111d, respectively. While the substrate stage 104 is positioned at the predetermined position, the identifiers OPa to OPd are detected by the corresponding first heads 112a to 112d to detect the origin positions of the diffraction gratings 111a to 111d.

The substrate stage 104 is driven so that the alignment plate 115 is positioned at a measurement position MP of the alignment scope 114. The substrate stage 104 is driven so that the alignment mark 115a among the plurality of alignment marks 115a to 115i formed on the alignment plate 115 is positioned at the measurement position MP of the alignment scope 114, as shown in, for example, FIG. 4A. The alignment mark 115a is detected by the alignment scope 114. At this time, the coordinates of the diffraction grating 111c (the position on the diffraction grating 111c) are detected by the first head 112c and second head 113c using the position of the alignment mark 115a (that is, the position of the substrate stage 104) detected by the alignment scope 114 as a reference position. The plurality of alignment marks 115a to 115i are formed on the alignment plate 115, as described above. Similarly, the coordinates of the diffraction grating 111c are detected by the first head 112c and second head 113c while the alignment marks 115b to 115i are sequentially detected by the alignment scope 114, as shown in FIGS. 4B to 4D. For example, FIG. 4B shows the state in which the coordinates of the diffraction grating 111c are detected by the first head 112c and second head 113c while the alignment mark 115d is detected by the alignment scope 114. FIG. 4C shows the state in which the coordinates of the diffraction grating 111b are detected by the first head 112c and second head 113c while the alignment mark 115g is detected by the alignment scope 114. FIG. 4D shows the state in which the coordinates of the diffraction grating 111c are detected by the first head 112c and second head 113c while the alignment mark 115i is detected by the alignment scope 114. Also, referring to FIGS. 4A to 4D, filled circles (dots) indicate the coordinates of the diffraction grating 111c detected by the first head 112c and second head 113c.

Figure 5A:
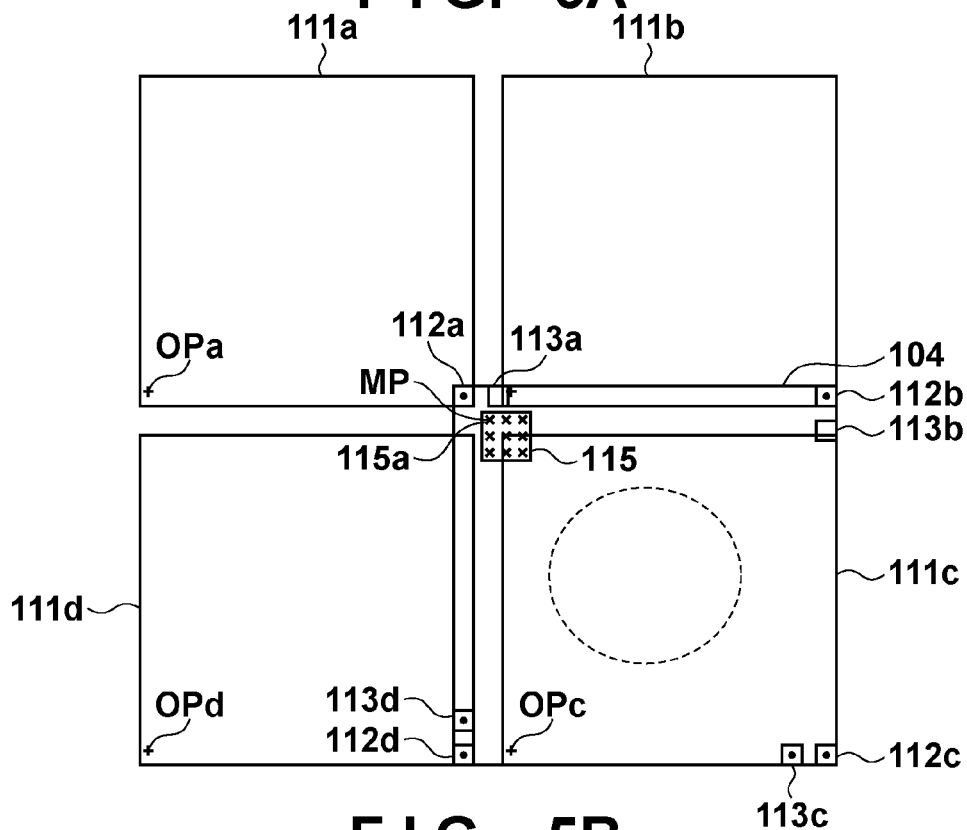
FIGS. 5A and 5B are views showing the positional relationships among the diffraction gratings, first heads, and second heads while the alignment marks are detected by the alignment scope.
Figure 5B:
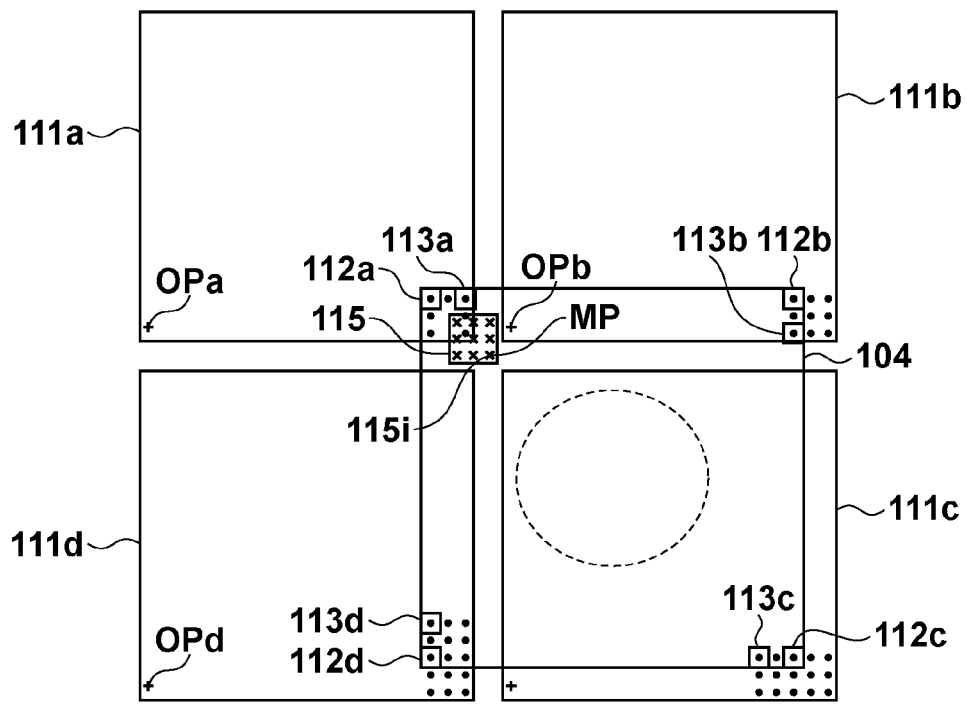

Note that referring to FIGS. 4A to 4D, the coordinates of the diffraction grating 111c are detected by the first head 112c and second head 113c while the alignment marks 115a to 115i are sequentially detected by the alignment scope 114. However, in practice, the coordinates of the diffraction gratings 111a, 111b, and 111d are detected by the corresponding first heads 112a, 112b, and 112d and second heads 113a, 113b, and 113d, as shown in FIGS. 5A and 5B. That is, the coordinates of the diffraction gratings 111a to 111d are detected by the corresponding first heads 112a to 112d and second heads 113a to 113d while the alignment marks 115a to 115i are sequentially detected by the alignment scope 114. FIG. 5A shows the state in which the coordinates of the diffraction gratings 111a to 111d are detected by the corresponding first heads 112a to 112d and second heads 113a to 113d while the alignment mark 115a is detected by the alignment scope 114. FIG. 5B shows the state in with the coordinates of the diffraction gratings 111a to 111d are detected by the corresponding first heads 112a to 112d and second heads 113a to 113d while the alignment mark 115i is detected by the alignment scope 114. Also, referring to FIGS. 5A and 5B, filled circles (dots) indicate the coordinates of the diffraction gratings 111a to 111d detected by the first heads 112a to 112d and second heads 113a to 113d.

Figure 6E:
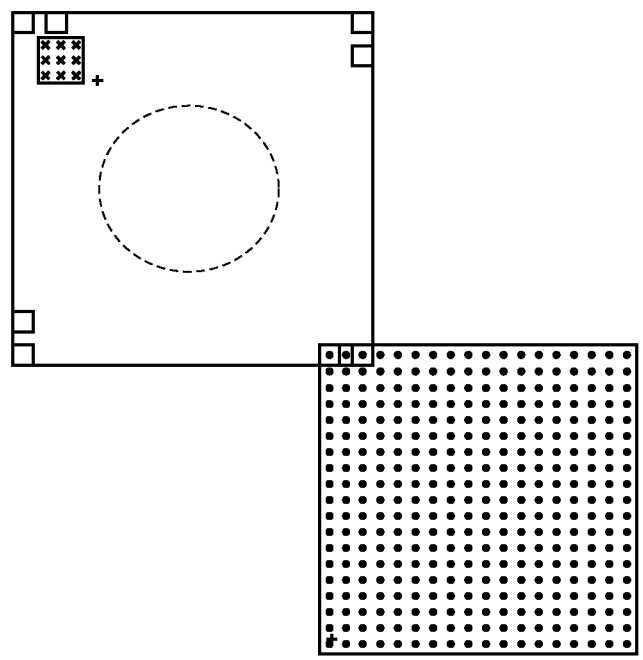

The substrate stage 104 is driven so that one head of the first head 112c and second head 113c can detect the coordinates of the diffraction grating 111c detected by the other head. The coordinates of the diffraction grating 111c are detected by the second head 113c while those of the diffraction grating 111c previously detected by the second head 113c are positioned at the center of the field of view of the first head 112c, as shown in, for example, FIG. 6A. At this time, the coordinates of the diffraction grating 111c detected by the second head 113c are coordinates (position) different from those of the diffraction grating 111c previously detected by the second head 113c. Note that the coordinates (in the Z direction) of the diffraction grating 111c in a state shown in FIG. 6D and subsequent states cannot be measured by the first head 112c and second head 113c alone. However, in practice, the coordinates of the diffraction gratings 111a, 111b, and 111d are simultaneously measured by the other first heads 112a, 112b, and 112d and the other second heads 113a, 113b, and 113d. Hence, while the coordinates of the diffraction grating 111b are measured by the first head 112b and second head 113b, those of the diffraction gratings 111a, 111c, and 111d are simultaneously measured, for example. This makes it possible to measure the coordinates of the diffraction grating 111c even in a state shown in FIG. 6D and subsequent states.

By repeating such a process, the entire surface of the diffraction grating 111c (its coordinates) is detected (that is, this process is repeated until the entire surface of the diffraction grating 111c is detected), as shown in FIGS. 6B to 6E. Referring to FIGS. 6B to 6E, filled circles (dots) indicate the coordinates of the diffraction grating 111c detected by the first head 112c and second head 113c. The deformation amount of the diffraction grating 111c can be obtained based on the detection results obtained by the first head 112c and second head 113c. Note that obtaining of the deformation amount of the diffraction grating 111c has been described with reference to FIGS. 6A to 6E. However, in practice, the same process is performed for the diffraction gratings 111a, 111b, and 111d using the first heads 112a, 112b, and 112d and second heads 113a, 113b, and 113d, respectively. This makes it possible to obtain the deformation amounts of the diffraction gratings 111a, 111b, and 111d.

To position the substrate stage 104, first, a process (second process) of correcting the position of the substrate stage 104 relative to the reference frame 107, which is measured by the measurement unit 110, based on the deformation amounts of the diffraction gratings 111a to 111d is performed. This makes it possible to reduce measurement errors generated by the measurement unit 110 due to deformation of the diffraction gratings 111a to 111d, thus positioning the substrate stage 104 with high accuracy.

Figure 7A:
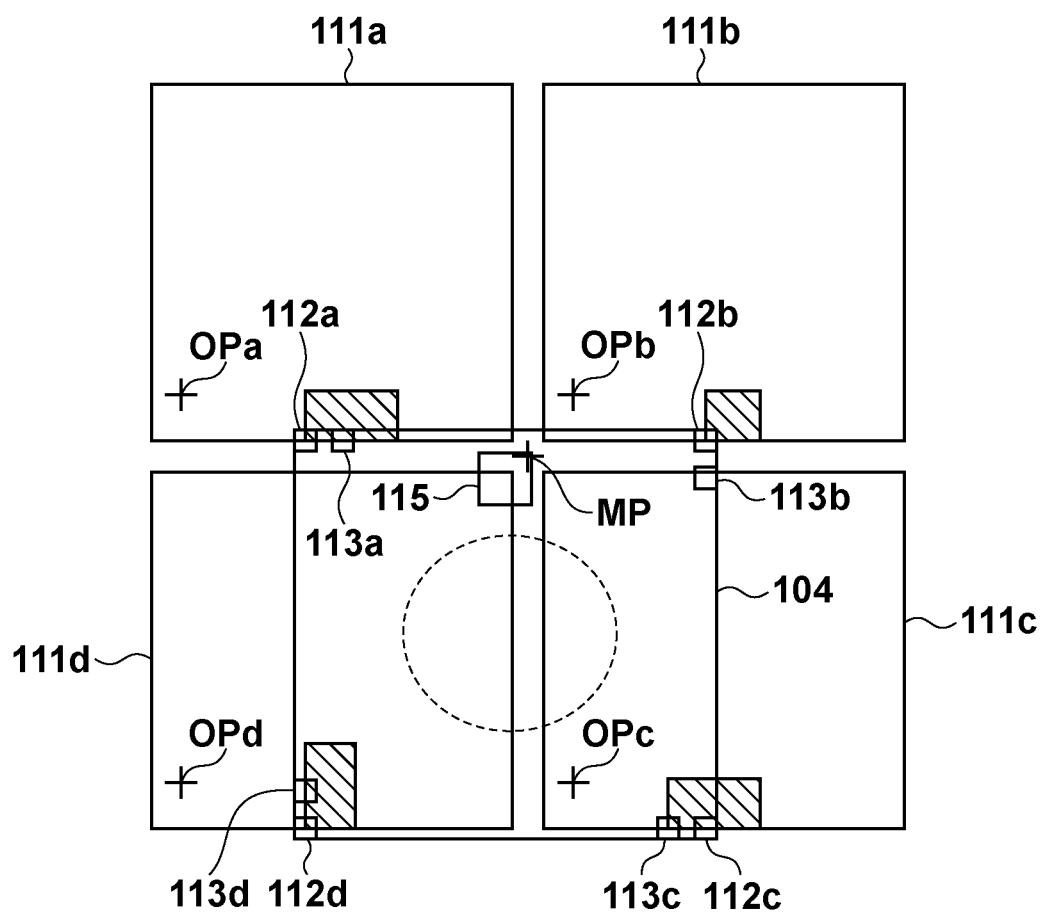
FIGS. 7A to 7C are views illustrating an example of the arrangement of the alignment plate.
Figure 7B:
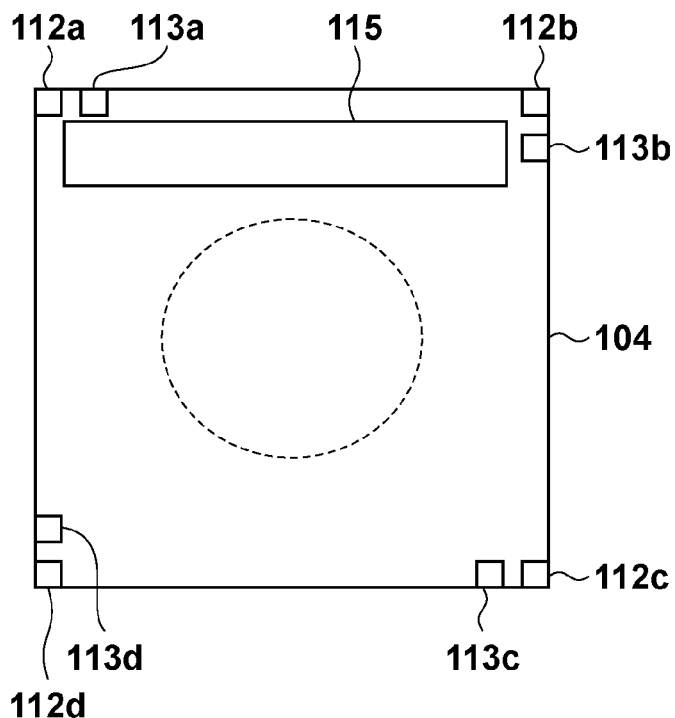
Figure 7C:
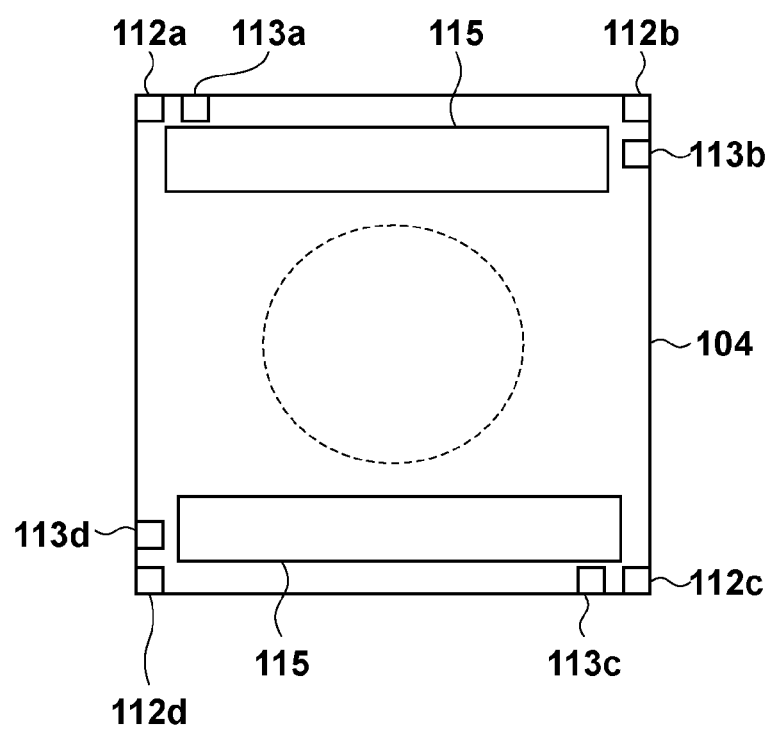

The position or dimension of the alignment plate 115 on the substrate stage 104 can be changed, as shown in FIGS. 7A to 7C. When the deformation amounts of the diffraction gratings 111a to 111d are obtained by the above-mentioned process, in practice, the obtained deformation amounts include errors resulting from factors associated with the alignment scope 114 or the alignment marks 115a to 115i formed on the alignment plate 115. Therefore, when measurement which uses the positions of the alignment marks 115a to 115i detected by the alignment scope 114 as reference positions is repeated, the errors accumulate (increase). To reduce such errors, the alignment plate 115 need only be placed, as shown in, for example, FIG. 7A. Referring to FIG. 7A, the alignment plate 115 is placed so that the initial detection position used to detect the coordinates (position) on each of the diffraction gratings 111a to 111d by the first heads 112a to 112d and second heads 113a to 113d is in the vicinity of the center of the X-coordinate axis on this diffraction grating. In detecting the coordinates on each of the diffraction gratings 111a to 111d in the positive or negative direction of the X-coordinate axis, the initial detection position defined by the vicinity of the center of the X-coordinate axis is used as a reference. This makes it possible to decrease the number of times of repetition of measurement in the positive or negative direction of the X-coordinate axis from the initial detection position, thus reducing the accumulated errors. The accumulated errors can also be reduced by increasing the dimension of the alignment plate 115, as shown in FIG. 7B, or by using a plurality of alignment plates 115, as shown in FIG. 7C.

Also, the distances between the first heads 112a to 112d and the second heads 113a to 113d may deviate from a design distance. In such a case, the deformation amounts of the diffraction gratings 111a to 111d obtained by the above-mentioned process include errors resulting from the amounts of deviation of the distances between the first heads 112a to 112d and the second heads 113a to 113d from a design distance. A process of reducing these errors will be described with reference to FIGS. 8A to 8C. Note that a case in which the distances between the first heads 112a to 112d and the second heads 113a to 113d deviate only in one axial direction (X-axis direction) will be taken as an example herein.

Figure 8A:
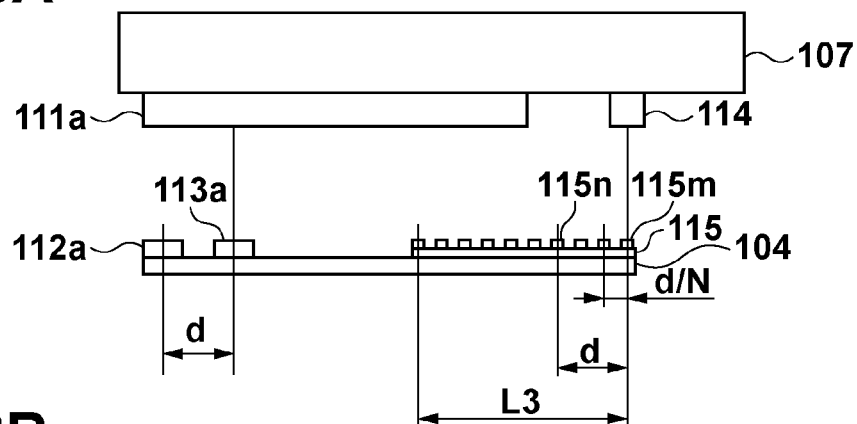
FIGS. 8A to 8C are views for explaining a process of reducing errors resulting from the amounts of deviation of the distances between the first heads and the second heads from a design distance.

As shown in FIG. 8A, the distance between the first head 112a and the second head 113a is d, and that between adjacent alignment marks formed on the alignment plate 115 is d/N (N is an arbitrary natural number). Also, the distance between an alignment mark formed at the right end and that formed at the left end is L3 (equal to or larger than d). Therefore, the alignment marks formed on the alignment plate 115 include a first alignment mark 115m and second alignment mark 115n formed at a distance equal to the distance d between the first head 112a and the second head 113a.

First, the substrate, stage 104 is positioned so that the alignment scope 114 detects the first alignment mark 115m, thereby detecting the coordinates (position) of the diffraction grating 111a by the second head 113a (third process), as shown in FIG. 8A.

Figure 8B:
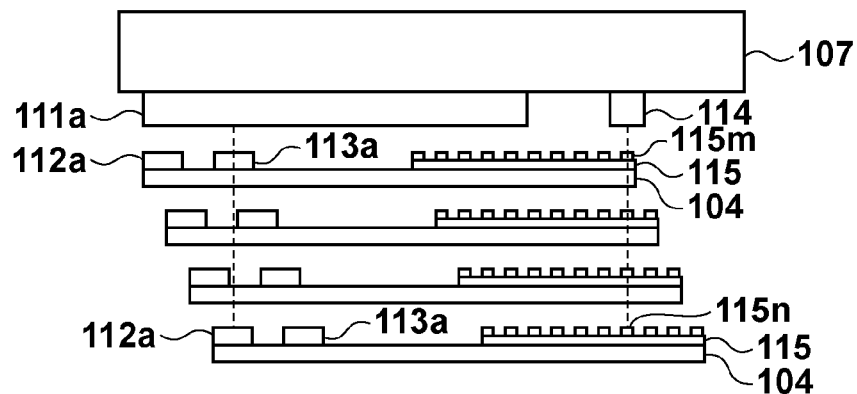

The alignment marks formed adjacent to the first alignment mark 115m on the left are sequentially detected by the alignment scope 114, as shown in FIG. 8B. The substrate stage 104 is positioned so that the alignment scope 114 detects the second alignment mark 115n, thereby detecting the coordinates (position) of the diffraction grating 111a by the first head 112a (fourth process). Note that referring to FIG. 8B, the position of the substrate stage 104 which moves only horizontally in practice moves downward as well.

The difference between the coordinates of the diffraction grating 111a detected by the second head 113a upon the detection of the first alignment mark 115m, and those of the diffraction grating 111a detected by the first head 112a upon the detection of the second alignment mark 115n is obtained. This difference is determined as the amount of deviation of the distance between the first head 112a and the second head 113a from a design distance (fifth process). Note that the amounts of deviation of the distances between the first heads 112b to 112d and the second heads 113b to 113d from the design distance can be similarly obtained.

The distance between the first head 112a and the second head 113a is ideally d (design distance), but deviates by Δd from the design distance in practice. The amount of deviation Δd from the design distance normally has a very small value, so the amount of error generated upon detection of the amount of deviation Δd is very small even if the diffraction grating 111a has deformed.

In positioning the substrate stage 104, first, the position of the substrate stage 104 relative to the reference frame 107, which is measured by the measurement unit 110, is corrected based on the deformation amounts of the diffraction gratings 111a to 111d and the amounts of deviation Δd. This makes it possible to reduce measurement errors generated by the measurement unit 110 due to deformation of the diffraction gratings 111a to 111d and the amounts of deviation from a design distance, thus positioning the substrate stage 104 with high accuracy.

Figure 8C:
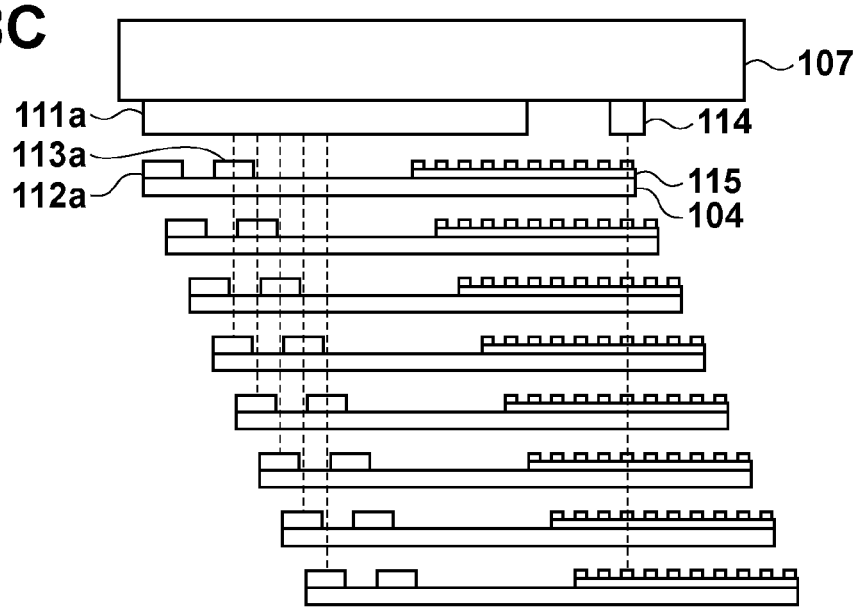

Note that as shown in FIG. 8C, the amount of deviation of the distance between each pair of two heads from a design distance is obtained based on the detection results of a plurality of different coordinates (positions) on the corresponding diffraction grating, thereby reducing errors resulting from deformation of this diffraction grating, thus obtaining this amount of deviation from the design distance with higher accuracy.

Figure 9:
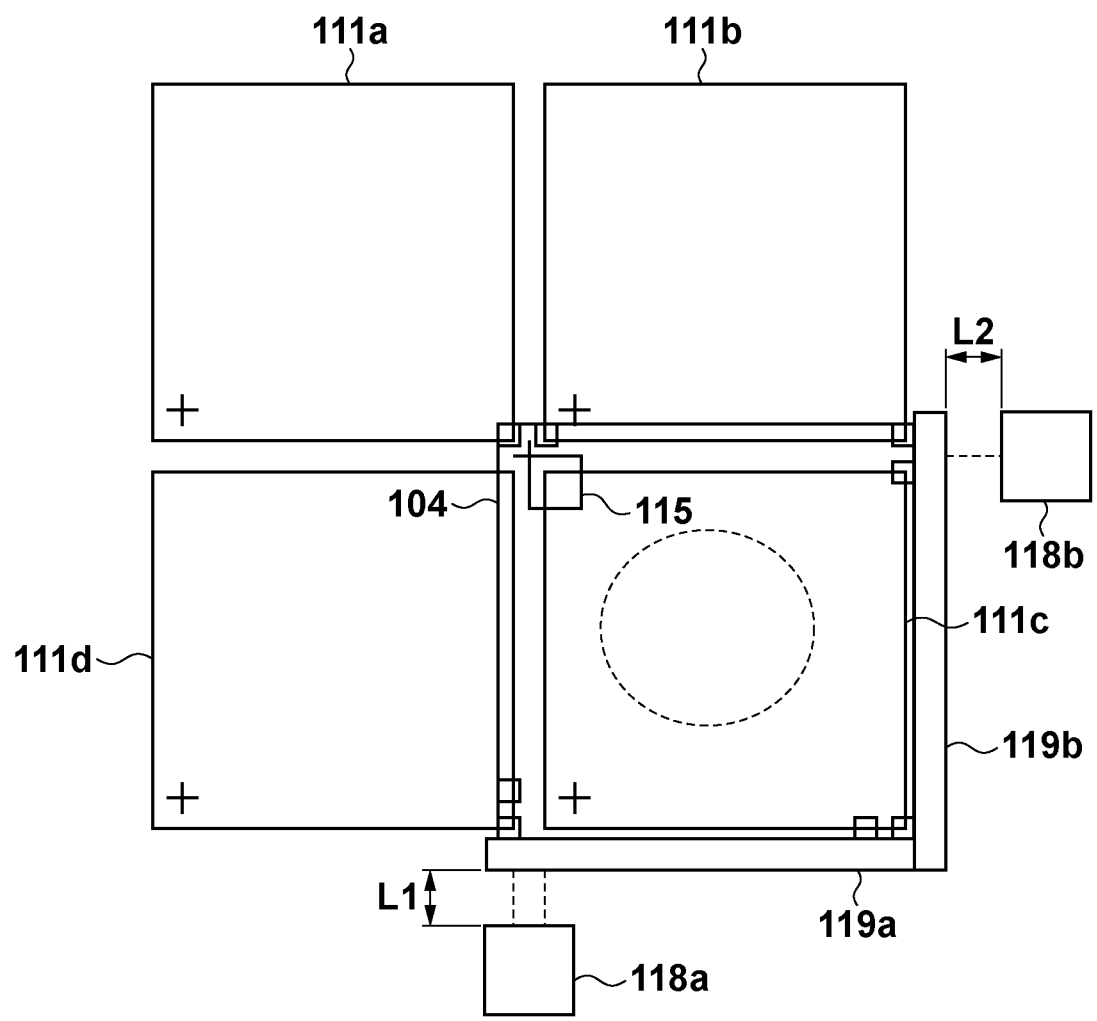
FIG. 9 is a view for explaining detection of the amount of deviation of each alignment mark from an ideal position using interferometers.

Also, the alignment marks 115a to 115i formed on the alignment plate 115 may deviate from ideal positions. In such a case, the amounts of deviation of the alignment marks 115a to 115i from ideal positions need only be detected using interferometers 118a and 118b, as shown in FIG. 9.

The interferometers 118a and 118b are provided (fixed) on the reference frame 107, and detect the position of the substrate stage 104 by detecting light beams which travel along measurement axes, are reflected by interferometer mirrors 119a and 119b provided on the substrate stage 104, and travel back along the measurement axes. However, the interferometers 118a and 118b also function as a detection unit which detects the amounts of deviation of the alignment marks 115a to 115i from ideal positions, as described above. In a space having its temperature, air temperature, and humidity maintained (managed) constant, the accuracies of the interferometers 118a and 118b are proportional to optical path lengths L1 and L2, respectively, of the measurement axes. Therefore, as the optical path lengths L1 and L2 shorten, the interferometers 118a and 118b can detect the amounts of deviation of the alignment marks 115a to 115i from ideal positions with higher accuracies.

In detecting the amounts of deviation of the alignment marks 115a to 115i from ideal positions, first, the substrate stage 104 is driven to a position at which each alignment mark can be detected by the alignment scope 114. This position is based on the position (ideal position) of each alignment mark in terms of design. The alignment marks 115a to 115i formed on the alignment plate 115 are detected by the alignment scope 114. At this time, the amounts of deviation of the alignment marks 115a to 115i from the ideal positions are detected by the interferometers 118a and 118b. Correction positions obtained by correcting the positions of the alignment marks 115a to 115i (that is, the position of the substrate stage 104), which are detected by the alignment scope 114, based on the amounts of deviation of the alignment marks 115a to 115i from the ideal positions are used as reference positions. This makes it possible to detect the coordinates (position) on each of the diffraction gratings 111a to 111d with high accuracy even if the relative positions between the alignment marks formed on the alignment plate 115 deviate from ideal relative positions.

Also, although a case in which the positions of the alignment marks 115a to 115i formed on the alignment plate 115 are used as reference positions has been described above, the position of the substrate stage 104 measured by the interferometers 118a and 118b can also be used as a reference position. In other words, the position of the substrate stage 104 measured in the range in which the optical path lengths L1 and L2 are sufficiently short can be used as a reference position without using the alignment plate 115.

When the substrate stage 104 is positioned at a position at which the optical path lengths L1 and L2 are sufficiently short, the interferometers 118a and 118b have accuracies equal to or greater than those of the first heads 112a to 112d and second heads 113a to 113d. In this case, as the measurement ranges of the interferometers 118a and 118b are equal to or larger than the distance d between the first heads 112a to 112d and the second heads 113a to 113d, the coordinates (positions) of the entire surfaces of the diffraction gratings 111a to 111d can be detected with high accuracy by the above-mentioned process.

More specifically, first, the origin positions of the diffraction gratings 111a to 111d are detected by the first heads 112a to 112d and second heads 113a to 113d. The substrate stage 104 is driven to a specific position defined in advance, while the position of the substrate stage 104 is measured by the interferometers 118a and 118b. This specific position is the position of the substrate stage 104, at which the optical path lengths L1 and L2 are sufficiently short. In this state, the coordinates (positions) of the diffraction gratings 111a to 111d are detected by the corresponding first heads 112a to 112d and second heads 113a to 113d using the position of the substrate stage 104 measured by the interferometers 118a and 118b as a reference position. The substrate stage 104 is sequentially driven while the position of the substrate stage 104 is measured by the interferometers 118a and 118b, thereby detecting the coordinates of the diffraction gratings 111a to 111d by the corresponding first heads 112a to 112d and second heads 113a to 113d. FIGS. 10A to 10C show the states in which the coordinates of the diffraction grating 111c are detected by the first head 112c and second head 113c while the position of the substrate stage 104 is measured by the interferometers 118a and 118b. Referring to FIGS. 10A to 10C, filled circles (dots) indicate the coordinates of the diffraction grating 111c detected by the first head 112c and second head 113c.

Figure 11B:
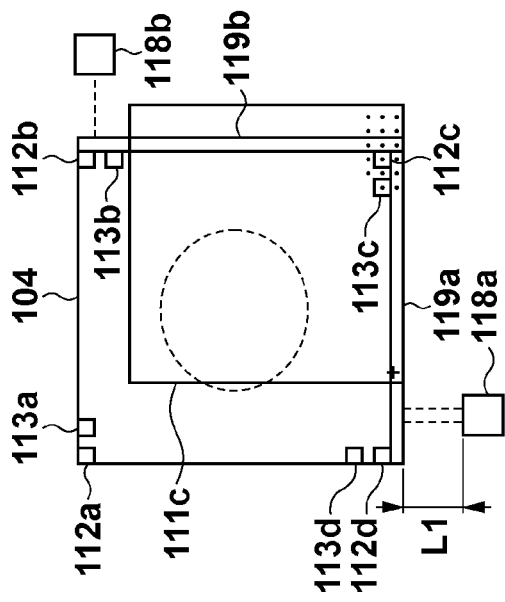
FIGS. 11A to 11C are views showing the positional relationships among the diffraction grating, first heads, and second heads while the entire surface of the diffraction grating is detected.
Figure 11A:
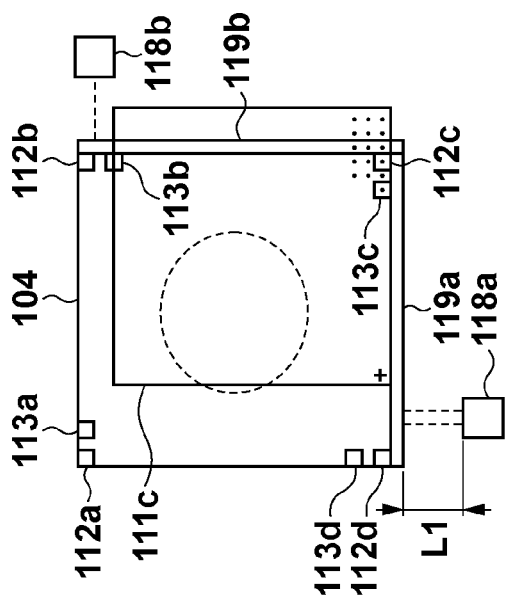
Figure 11C:
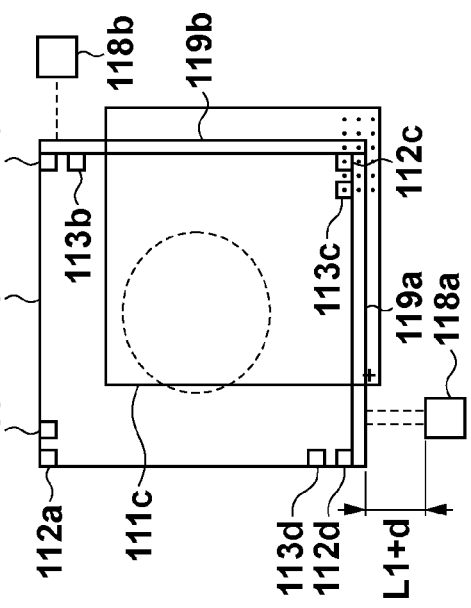

The substrate stage 104 is driven so that one head of the first head 112c and second head 113c can detect the coordinates of the diffraction grating 111c detected by the other head. The coordinates of the diffraction grating 111c are detected by the second head 113c while those of the diffraction grating 111c previously detected by the second head 113c are positioned at the center of the field of view of the first head 112c, as shown in, for example, FIG. 11A. At this time, the coordinates of the diffraction grating 111c detected by the second head 113c are coordinates (position) different from those of the diffraction grating 111c previously detected by the second head 113c. By repeating such a process, the entire surface of the diffraction grating 111c (its coordinates) is detected (that is, this process is repeated until the entire surface of the diffraction grating 111c is detected), as shown in FIGS. 11A to 11C. Referring to FIGS. 11A to 11C, filled circles (dots) indicate the coordinates of the diffraction grating 111c detected by the first head 112c and second head 113c. The deformation amount of the diffraction grating 111c can be obtained based on the detection results obtained by the first head 112c and second head 113c. Note that obtaining of the deformation amount of the diffraction grating 111c has been described with reference to FIGS. 10A to 10C and 11A to 11C. However, in practice; the same process is performed for the diffraction gratings 111a, 111b, and 111d using, the first heads 112a, 112b, and 112d and second heads 113a, 113b, and 113d, respectively. This makes it possible to obtain the deformation amounts of the diffraction gratings 111a, 111b, and 111d.

Figure 12:
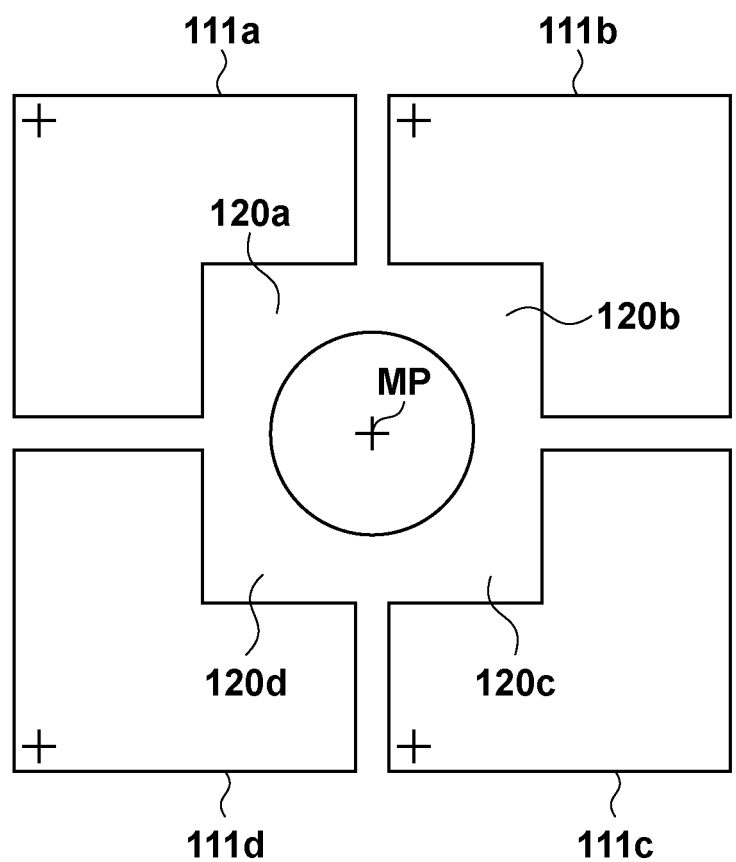
FIG. 12 is a view illustrating an example of the arrangement of the diffraction gratings.

Also, the diffraction gratings 111a to 111d may include notches 120a to 120d, respectively, as shown in FIG. 12. The deformation amounts of even the diffraction gratings 111a to 111d including the notches 120a to 120d, respectively, can be obtained by the above-mentioned process.

Moreover, the exposure apparatus 100 may include a plurality of sets of a substrate stage 104 and diffraction gratings 111a to 111d corresponding to first heads and second heads provided on the substrate stage 104. Assume, for example, that the exposure apparatus 100 has the so-called twin-stage configuration which includes two sets of a substrate stage 104 and diffraction gratings 111a to 111d corresponding to first heads and second heads provided on the substrate stage 104.

In the twin-stage configuration, it is often the case that an alignment process is performed in a measurement station while an exposure process is performed in an exposure station, and two substrate stages move between these two stations by swapping their positions. The positional relationships among first heads, second heads, and alignment plates provided on the two substrate stages, and those among alignment marks formed on the alignment plates provided on the two stages are ideally the same. However, the positional relationships among first heads, second heads, and alignment plates provided on the two substrate stages, and those among alignment marks formed on the alignment plates provided on the two stages are different in practice. Therefore, it is necessary to perform the above-mentioned process in each of the measurement station and the exposure station. When diffraction gratings provided in each of the measurement station and the exposure station have an arrangement as shown in, for example, FIG. 2, the above-mentioned process must be performed four times. Hence, letting M be the number of substrate stages, and N be the number of diffraction grating detection regions, the above-mentioned process is performed M×N times.

Although the number of times of detection of the coordinates (positions) of the diffraction gratings and the alignment marks formed on the alignment plate has not specifically been described in this embodiment, it can be arbitrarily set in accordance with the required accuracy.

Also, the timing at which the above-mentioned process is performed, that is, the deformation amount of each diffraction grating is obtained can be generally set at that of periodical maintenance. However, it is also possible to periodically obtain the deformation amount of each diffraction grating during the normal operation of the exposure apparatus, and provide an error notification or perform the above-mentioned process if the change in deformation amount exceeds a predetermined reference value. This makes it possible to cope with strain (deformation) of each diffraction grating due to a temporal change or a change in temperature distribution of this diffraction grating, thus stabilizing the positioning accuracy of the substrate stage in the medium- to long-range term.

Moreover, as methods of obtaining the amount of deviation of each alignment mark formed on the alignment plate from an ideal position, not only the above-mentioned method which employs the interferometers 118a and 118b but also, for example, the following two methods are available. Note that the above-mentioned method which employs the interferometers 118a and 118b uses the alignment scope 114. However, the amount of deviation of each alignment from an ideal position can also be obtained using an alignment scope which measures the position of the reticle 102 (and the relative position between the reticle 102 and the substrate 105).

The first method uses a reference substrate. More specifically, first, a reference substrate is placed on the substrate stage 104. A reference mark on the reference substrate is detected by the alignment scope 114 while the coordinates (positions) of the diffraction gratings 111a to 111d are detected by the corresponding first heads 112a to 112d and second heads 113a to 113d. The amount of deviation of each alignment mark formed on the alignment plate 115 from an ideal position is obtained with reference to the position of the reference mark on the reference substrate.

The second method uses an inspection reticle and an inspection substrate. First, an inspection reticle is placed on the reticle stage 106, and an inspection substrate is placed on the substrate stage 104. Each alignment mark formed on the alignment plate 115 is detected by the alignment scope 114. The inspection substrate is exposed to light while the coordinates of the diffraction gratings 111a to 111d are detected by the corresponding first heads 112a to 112d and second heads 113a to 113d with reference to the position of each alignment mark. The amount of deviation of each alignment mark formed on the alignment plate 115 from an ideal position is obtained with reference to the result of exposure on the inspection substrate.

Also, if a sensor which measures the optical axis position of the projection optical system is placed on the substrate stage, it may be used in place of the alignment scope 114. That is, the above-mentioned process can also be performed with reference to the optical axis center position of the projection optical system.

In this manner, the exposure apparatus 100 positions the substrate stage 104 by correcting the position of the substrate stage 104, which is measured by the first heads 112a to 112d and second heads 113a to 113d, based on the deformation amounts of the diffraction gratings 111a to 111d. Hence, the exposure apparatus 100 can provide high-quality devices (for example, a semiconductor device, an LCD device, an image sensing device (for example, a CCD), and a thin-film magnetic head) by improving the positioning accuracy of the substrate stage 104. These devices are fabricated through a step of exposing a substrate (for example, a wafer or a glass plate) coated with a photoresist (photosensitive agent) using the exposure apparatus 100, a step of developing the exposed substrate, and subsequent known steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-084076 filed on Apr. 5, 2011, and No. 2012-048613 filed on Mar. 5, 2012, which are hereby incorporated by reference herein in their entirety.

What is claimed is:

1. A measurement apparatus which measures a position of a second object relative to a first object, the apparatus comprising:
a first measurement unit which includes a diffraction grating provided on the first object, and a first head and a second head provided on the second object, and is configured to measure the position of the second object relative to the first object by the first head or the second head; and
an alignment scope configured to measure the position of the second object by detecting a plurality of alignment marks provided on the second object, where a length, in an array direction of the first head and the second head, of a region in which the plurality of alignment marks are provided is equal to or larger than an interval between the first head and the second head,
a processing unit configured to perform a process of obtaining the position of the second object relative to the first object,
wherein the processing unit performs
a detection process of positioning the second object so that the alignment scope detects each of the plurality of alignment marks, thereby detecting a position on the diffraction grating by each of the first head and the second head,
a first process of obtaining a deformation amount of the diffraction grating by repeating a process, in which while a position on the diffraction grating previously detected by one head of the first head and the second head is positioned at the center of a field of view of the other head, a position different from the position on the diffraction grating previously detected by the one head is detected, until the one head detects an entire surface of the diffraction grating, using the position detected by the first head or the second head in the detection process as a reference position, and
a second process of correcting the position of the second object relative to the first object, which is measured by the first head or the second head, based on the deformation amount of the diffraction grating.

2. The apparatus according to claim 1, further comprising a detection unit configured to detect an amount of deviation of a position of the alignment mark from an ideal position,
wherein the processing unit uses a correction position obtained by correcting the position of the second object, which is measured by the alignment scope, based on the amount of deviation from the ideal position, which is detected by the detection unit.

3. The apparatus according to claim 1, wherein
the alignment mark includes a first alignment mark and a second alignment mark provided on the second object at a distance equal to the distance between the first head and the second head,
the processing unit performs
a third process of positioning the second object so that the alignment scope detects the first alignment mark, thereby detecting a position on the diffraction grating by the second head,
a fourth process of positioning the second object so that the alignment scope detects the second alignment mark, thereby detecting a position on the diffraction grating by the first head, and
a fifth process of obtaining, as an amount of deviation of the distance between the first head and the second head from a design distance, a difference between the position on the diffraction grating detected in the third process and the position on the diffraction grating detected in the fourth process, and
in the second process, the position of the second object relative to the first object, which is measured by the first head or the second head, is corrected based on the deformation amount of the diffraction grating and the amount of deviation from the design distance.

4. An exposure apparatus which exposes a substrate held by a stage to light, the apparatus comprising:
a measurement apparatus defined in claim 1, which is configured to measure a position of the stage relative to a reference frame, that defines an apparatus reference, using the reference frame as a first object and the stage as a second object; and
a positioning mechanism configured to position the stage based on the position of the stage relative to the reference frame, which is measured by the measurement apparatus.

5. A device fabrication method comprising steps of:
exposing a substrate using an exposure apparatus; and
performing a development process for the substrate exposed,
wherein the exposure apparatus includes:
a stage configured to hold the substrate;
a measurement apparatus configured to measure a position of the stage relative to a reference frame, that defines an apparatus reference; and
a positioning mechanism configured to position the stage based on the position of the stage relative to the reference frame, which is measured by the measurement apparatus,
the measurement apparatus includes:
a first measurement unit which includes a diffraction grating provided on the reference frame, and a first head and a second head provided on the stage, and is configured to measure the position of the stage relative to the reference frame by the first head or the second head; and
an alignment scope configured to measure the position of the stage object by detecting a plurality of alignment marks provided on the stage, where a length, in an array direction of the first head and the second head, of a region in which the plurality of alignment marks are provided is equal to or larger than an interval between the first head and the second head,
a processing unit configured to perform a process of obtaining the position of the stage relative to the reference frame, and the processing unit performs
a detection process of positioning the stage so that the alignment scope detects each of the plurality of alignment marks, thereby detecting a position on the diffraction grating by each of the first head and the second head,
a first process of obtaining a deformation amount of the diffraction grating by repeating a process, in which while a position on the diffraction grating previously detected by one head of the first head and the second head is positioned at the center of a field of view of the other head, a position different from the position on the diffraction grating previously detected by the one head is detected, until the one head detects an entire surface of the diffraction grating using the position detected by the first head or the second head in the detection process as a reference position, and
a second process of correcting the position of the stage relative to the reference frame, which is measured by the first head or the second head, based on the deformation amount of the diffraction grating.

* * * * *